(12) United States Patent
Wallstab

(10) Patent No.: US 6,933,742 B2
(45) Date of Patent: Aug. 23, 2005

(54) CHIP CARD CIRCUIT WITH MONITORED ACCESS TO A TEST MODE

(75) Inventor: Stefan Wallstab, München (DE)

(73) Assignee: Infineon Technologies AG, Munich (DE)

( * ) Notice: Subject to any disclaimer, the term of this patent is extended or adjusted under 35 U.S.C. 154(b) by 408 days.

(21) Appl. No.: 10/197,791

(22) Filed: Jul. 18, 2002

(65) Prior Publication Data
US 2003/0065932 A1 Apr. 3, 2003

Related U.S. Application Data

(63) Continuation of application No. PCT/DE01/00141, filed on Jan. 15, 2001.

(30) Foreign Application Priority Data

Jan. 18, 2000 (EP) .............................................. 00100952

(51) Int. Cl.⁷ ............................................. H03K 19/00
(52) U.S. Cl. ............................. 326/8; 326/38; 327/525
(58) Field of Search ............................... 326/8, 82, 83, 326/87, 37, 38, 9, 16; 327/525

(56) References Cited

U.S. PATENT DOCUMENTS

| 5,305,267 | A  |   | 4/1994  | Haraguchi et al. |
| 5,617,366 | A  |   | 4/1997  | Yoo |
| 6,121,820 | A  | * | 9/2000  | Shishikura .................. 327/525 |
| RE36,952  | E  | * | 11/2000 | Zagar et al. ................... 326/44 |
| 6,281,739 | B1 | * | 8/2001  | Matsui ........................ 327/525 |
| 6,353,336 | B1 | * | 3/2002  | Lindley et al. ............... 326/83 |
| 6,628,144 | B2 | * | 9/2003  | Loughmiller et al. ....... 326/101 |
| 6,686,790 | B2 | * | 2/2004  | Cutter et al. ................ 327/525 |

* cited by examiner

Primary Examiner—Don Le
(74) Attorney, Agent, or Firm—Laurence A. Greenberg; Werner H. Stemer; Ralph E. Locher

(57) ABSTRACT

A circuit for monitoring an entry into a test mode of a chip circuit has a fusible link which can be fired via a firing transistor. A flipflop, which permits access to the test mode, is set by a resulting voltage drop, with the aid of an edge detector. The number of times the test mode has been accessed can be detected from the number of fired fusible links.

14 Claims, 2 Drawing Sheets

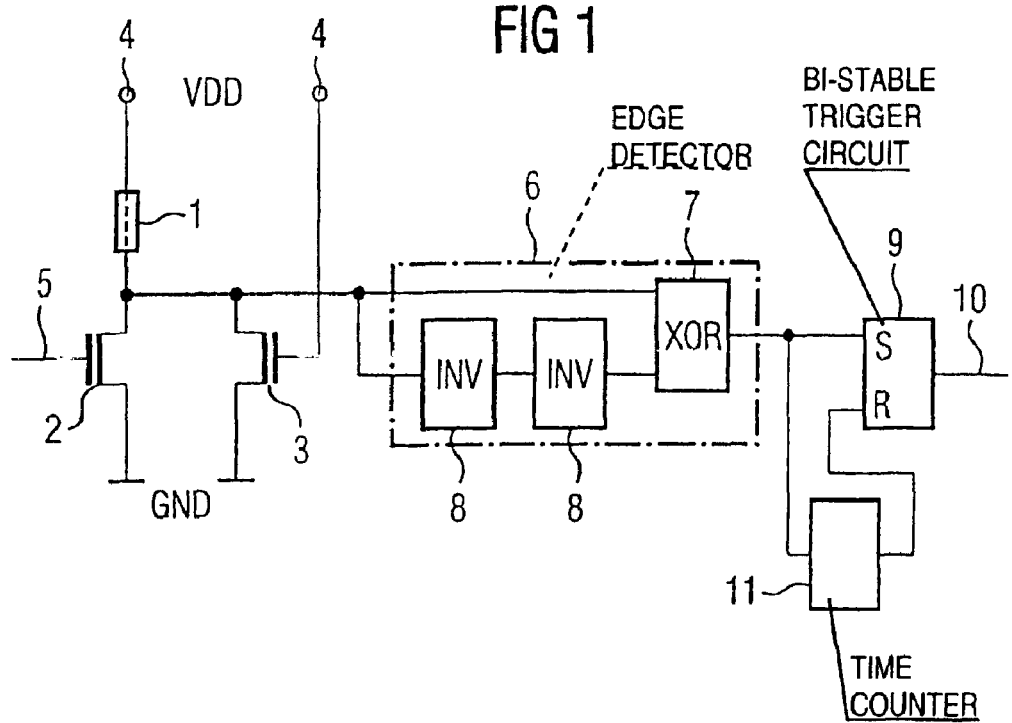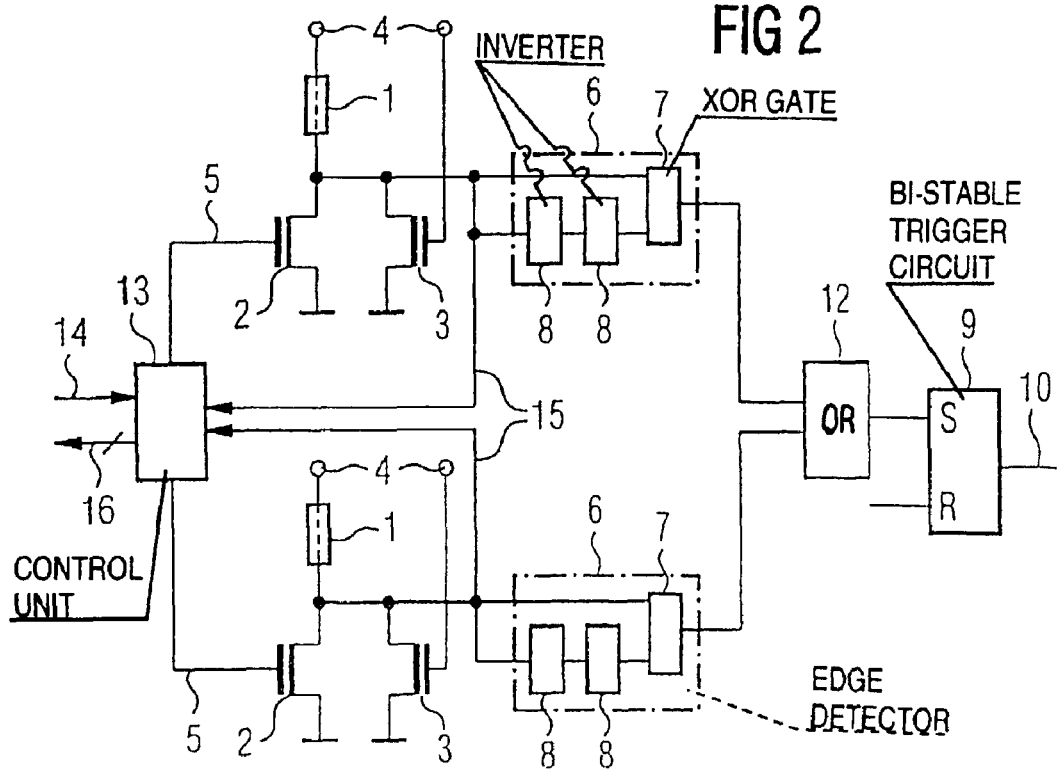

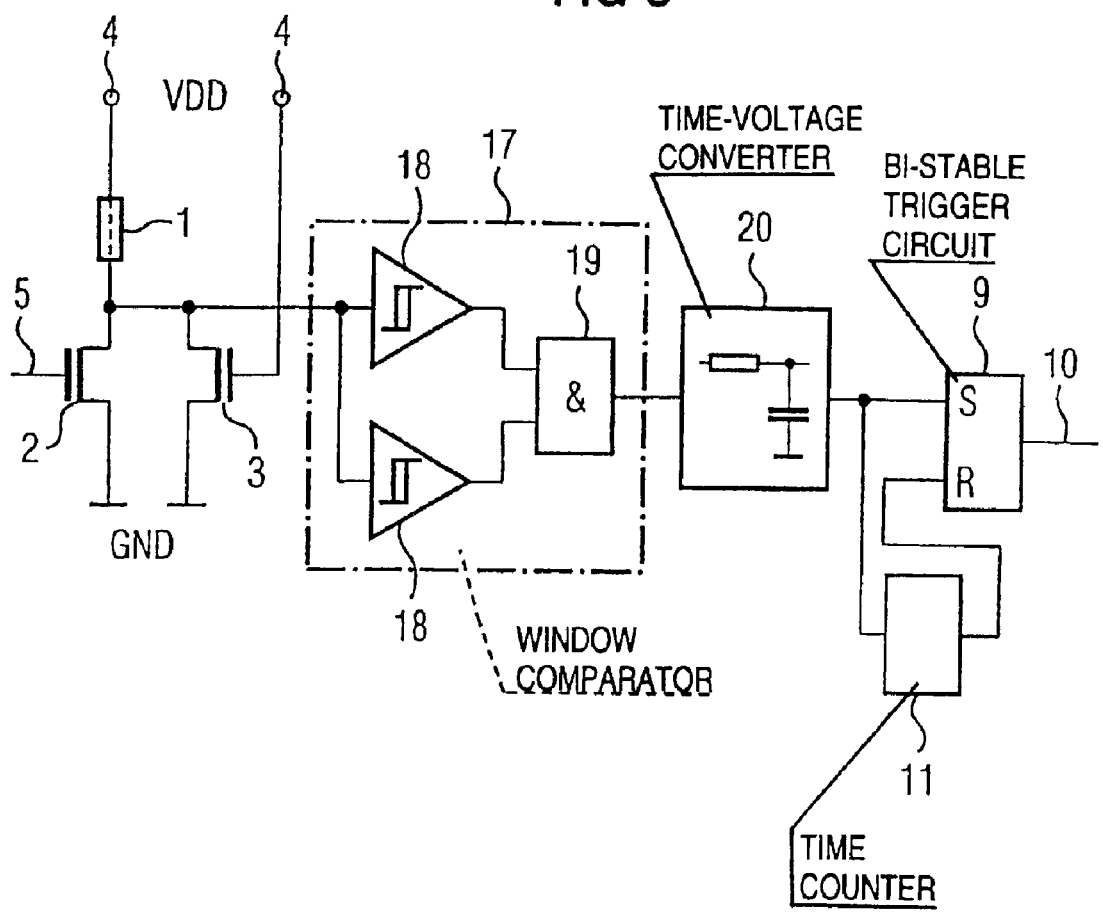

CHIP CARD CIRCUIT WITH MONITORED ACCESS TO A TEST MODE

CROSS-REFERENCE TO RELATED APPLICATION

This application is a continuation of copending International Application No. PCT/DE01/00141, filed Jan. 15, 2001, which designated the United States and was not published in English.

BACKGROUND OF THE INVENTION

Field of the Invention

The invention relates to a circuit for chip cards or security chips with at least one switching element whose switching state determines whether a test mode of the circuit can be accessed.

In the production of chip cards or security chips, sometimes part of the production is contracted out to other companies. For example, the mounting or integration of chips in chip cards is performed by other companies. Since test functions still have to be performed after the mounting of the chips in the chip cards, the test mode cannot be definitively blocked before delivery to the other company. It may therefore be possible for the other companies to carry out a detailed analysis of the chips.

To block access to the test mode of the chip circuit, generally what are known as OTP cells (OTP=one-time programmable) are provided. The OTP cells may be both fuses or antifuses. The fuses and antifuses are components which are set to a nonconducting or conducting state by the application of an external signal. With these, only one switching operation is possible in each case. A fuse which has been set to the nonconducting state cannot be reset to the conducting state and an antifuse which has been set to the conducting state cannot be subsequently returned again to the nonconducting state. The fuses or antifuses are usually set to the nonconducting or conducting state after completion of the production process and access to the test mode of the chip circuit is consequently blocked.

Since, however, test functions are still to be performed after the mounting of the chip in a chip card by another company, access to the test mode cannot be definitively blocked. The other company consequently has unhindered access to the test mode and may be able to perform detailed analyses of the circuit.

A technical solution to this problem is not known. Therefore, until now reliance has been placed exclusively on legal and organizational solutions.

SUMMARY OF THE INVENTION

It is accordingly an object of the invention to provide a circuit for chip cards or security chips which overcomes the above-mentioned disadvantages of the heretofore-known circuits of this general type and which at least makes it more difficult for unauthorized persons to access the test mode.

With the foregoing and other objects in view there is provided, in accordance with the invention, a circuit configuration; including:

a circuit having a switching element configured to be switched only once; and the circuit having a test mode, the switching element, when being actuated, causing a switching operation permitting access to the test mode of the circuit.

In other words, the object of the invention is achieved by a switching operation, occurring when at least one switching element, which can be switched once, is actuated and thus permits access to the test mode of the circuit.

Since the switching operation as such sets the circuit to the test mode, to enter the test mode a switching element must be actuated each time. The number of actuated switching elements consequently corresponds to the number of times the test mode has been entered. If the number of times the test mode is entered is known before a contract is awarded to another company, unauthorized entry into the test mode by the other company can at least be detected. In this way, the psychological deterrence is increased significantly.

The limited number of possible times the test mode can be entered, corresponding to the number of switching elements, is not a disadvantage, since the test mode only has to be used a few times if production proceeds normally. It is therefore possible to allow entry into the test mode to be made dependent not on the state of the switching elements but on the switching operation itself. When the circuit is released for use in the field, finally, all the switching elements are actuated and entry into the test mode is definitively blocked as a result.

According to another feature of the invention, the switching element includes a fusible link or bridge and a firing transistor connected in series with the fusible link.

According to yet another feature of the invention, a sense transistor is connected in parallel to the firing transistor such that the fusible link, the sense transistor, and the firing transistor together form a voltage divider; and an edge detector is provided downstream of the voltage divider.

According to a further feature of the invention, a bi-stable trigger circuit is operatively connected to the edge detector such that the edge detector acts on the bi-stable trigger circuit.

According to another feature of the invention, the circuit is configured such that a given course of the switching operation permits access to the test mode of the circuit.

According to yet another feature of the invention, a sense transistor is connected in parallel to the firing transistor such that the fusible link, the sense transistor, and the firing transistor together form a voltage divider; a window comparator is provided downstream of the voltage divider; and a time-voltage converter is operatively connected to the window comparator such that the window comparator acts on the time-voltage converter.

According to a further feature of the invention, a bi-stable trigger circuit is provided downstream of the time-voltage converter.

According to yet a further feature of the invention, a time counter is operatively connected to the switching element such that the switching operation starts the time counter, and the time counter blocks the access to the test mode of the circuit after a given time.

According to another feature of the invention, the bi-stable trigger circuit has an input; and a time counter acts on the input of the bi-stable trigger circuit such that the switching operation starts the time counter, and the time counter blocks access to the test mode of the circuit after a given time.

According to yet another feature of the invention, a plurality of switching elements are configured to be individually actuated one after another.

According to a further feature of the invention, a control unit is operatively connected to the switching elements, the control unit is configured such that a number of actuated ones of the switching elements can be read out.

According to yet another feature of the invention, the control unit is a counter.

With the objects of the invention in view there is also provided, in combination with a chip card or a security chip, a circuit configuration, including:

a circuit having a switching element configured to be switched only once; and the circuit having a test mode, the switching element, when being actuated, causing a switching operation permitting access to the test mode of the circuit.

In the case of a further advantageous refinement of the invention, entry into the test mode is made dependent on a predetermined procedure of the switching operation.

This is advantageous because a repair of the switching element and renewed triggering generally leads to the switching operation proceeding in a completely different way. So if a specific predetermined chronological procedure for the switching operation exclusively permits entry into the test mode, even an alternative way of entering the test mode by repairing the switching element is not possible. It is consequently not possible at all, or only with disproportionately great expenditure, to get around the block formed by the switching elements by repairing individual switching elements.

In addition, the time during which access to the test mode is possible can be limited, in order to prevent as far as possible an analysis of the circuit by unauthorized persons.

Another embodiment of the invention therefore includes a time counter, which is started by the switching operation and re-blocks the test mode after a predetermined time.

Other features which are considered as characteristic for the invention are set forth in the appended claims.

Although the invention is illustrated and described herein as embodied in a chip card circuit with a monitored access to the test mode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram of a circuit according to the invention for chip cards which controls the access to a test mode;

FIG. 2 is a schematic circuit diagram of a circuit according to the invention which controls the access to a test mode with the aid of a plurality of switching elements; and FIG. 3 is a schematic circuit diagram of a circuit according to the invention which evaluates the course of the switching operation and in this way monitors access to the test mode.

DESCRIPTION OF THE PREFERRED EMBODIMENTS

Referring now to the figures of the drawings in detail and first, particularly, to FIG. 1 thereof, there is shown an access control circuit for chip cards which controls access to the test mode. The circuit has a fusible link 1, which is connected in series with a firing transistor 2. Provided parallel to the low-impedance firing transistor 2 is a high-impedance sense transistor 3, which keeps the ground end of the fusible link 1 constantly at a defined potential. If the fusible link 1 has not yet been fired and is consequently in the conducting state, the ground end of the fusible link 1 is at the potential of the current and voltage supply present at the terminals 4. If the fusible link 1 is fired by applying a control signal to an input 5 of the firing transistor 2, the fusible link 1 goes over into the nonconducting state. The sense transistor 3 then keeps the ground end of the fusible link 1 at ground potential. This is also the case when the firing transistor 2 has been turned off again.

An edge detector 6 is provided downstream of the voltage divider formed by the fusible link 1, the firing transistor 2 and the sense transistor 3. The edge detector 6 includes an XOR gate 7, the input of which has a gate formed by two inverters 8 provided upstream of it. A signal edge present at the edge detector 6 triggers at the beginning of the edge detector 6 a pulse of a duration which corresponds to the gate delay time via the inverters 8. This is so because different potentials are then briefly present at the inputs of the XOR gate 7, which is the condition for the XOR gate 7 to emit a logical 1. The pulse emitted at the output of the edge detector 6 can be used for setting an RS flipflop 9. The signal emitted at an output 10 of the RS flipflop 9 finally permits access to the test mode of the chip circuit. When the test mode is left, the RS flipflop 9 can be reset, for example through the use of software.

The pulse emitted by the edge detector 6 also allows the starting of a time counter 11 with a hard-wired starting value, which resets the RS flipflop 9 after the predetermined time.

Represented in FIG. 2 is a circuit which has a plurality of fusible links 1. By firing one of the fusible links 1 in each case, access to the test mode of the chip circuit is made possible. In a corresponding way, in the case of this circuit an OR gate 12 is connected between the outputs of the edge detectors 6 and the RS flipflop 9. To activate the individual fusible links 1, and to sense the number of fusible links 1 already fired, a control unit 13 is provided, which in the simplest case has a binary counter which is connected to an input 14 and has a downstream 1-of-n decoder. The control unit 13 also includes a priority decoder, which senses the logical signals present on return signalling lines 15 and emits on read-out lines 16 a number corresponding to the number of fired fusible links 1.

In the case of the access control circuits represented in FIG. 1 and FIG. 2, entry into the test mode of the chip circuit presupposes that one of the fusible links 1 is fired. It is consequently possible when contracting mounting work to other companies to detect improper entry into the test mode if the number of fired fusible links 1 after performance of a contract by a company performing mounting is higher than before delivery to the mounting company. The psychological deterrence is significantly increased as a result.

The time spent in the test mode can also be limited by simple measures, as in the case of the exemplary embodiment represented in FIG. 1. The time spent is expediently limited to the testing time required at most during a normal production process.

By coupling the access to the test mode to the firing of one of the fusible links 1, the number of entries into the test mode is limited. However, this is not disadvantageous, since only a limited number of tests are necessary during a normal production process. Conversely, entry into the test mode can be definitively blocked by burning all the fusible links 1.

This is the case if the chip card is released for use in the field and renewed entry into the test mode is to be prevented.

To increase the security of the access control circuit, entry into the test mode can be additionally made dependent on a specific current or voltage characteristic during the firing of the fusible link 1. The circuit represented in FIG. 3 allows access to the test mode only if the voltage drop at the ground end of the fusible link 1 extends over a certain time. For this purpose, a window comparator 17 is provided, which includes two parallel-connected Schmitt triggers 18, the outputs of which are connected to an AND gate 19. The switching levels of the Schmitt triggers 18 are set such that a logical 1 always appears at the output of the window comparator 17 whenever the voltage present at the input of the window comparator 17 lies between the predetermined switching thresholds of the Schmitt triggers 18. The duration of the pulse emitted at the output of the window comparator 17 is consequently characteristic of the duration of the voltage drop at the ground end of the fusible link 1. A voltage signal proportional to the duration of this pulse is generated by a time-voltage converter 20, formed in the simplest case by an RC element, at the output of the window comparator 17. This voltage signal switches the RS flipflop only whenever this voltage signal exceeds the switching threshold of the RS flipflop 9. Access to the test mode is consequently only possible when the voltage at the ground end of the fusible link 1 drops sufficiently slowly. This is the case when the fusible link 1 is fired by activating the transistor 2, since the voltage initially adjusts itself to a value which corresponds to the ratio of the resistance of the fusible link 1 and the internal resistance of the firing transistor 2, before it drops to ground potential after the melting of the fusible link 1. By contrast, a bridging of the fusible link 1 and an opening of this bridge would result in an immediate drop in the voltage at the ground end of the fusible link 1. Consequently, the evaluation of the chronological procedure of the switching operation allows the security of the access control circuit to be increased.

The exemplary embodiments presented here use a fusible link or so-called fuse. However, access control circuits of this type can also be realized with the aid of antifuses or generally OTP cells (OTP=one-time programmable). Of particular advantage in this case is the monitoring of the chronological procedure during the burning of the OTP cells, making it virtually impossible to get around the security provided by the OTP cells. This is because it is generally not possible at all, or only with disproportionately high expenditure, to repair an OTP cell in such a way that the same voltage and current characteristic as during firing for the first time is obtained during renewed firing of the OTP cell.

I claim:

1. A circuit configuration, comprising:
   a circuit having a switching element configured to be switched only once; and
   said circuit having a test mode, said switching element, when being actuated, causing a switching operation permitting access to the test mode of said circuit.

2. The circuit configuration according to claim 1, wherein said switching element includes a fusible link and a firing transistor connected in series with said fusible link.

3. The circuit configuration according to claim 2, including:
   a sense transistor connected in parallel to said firing transistor such that said fusible link, said sense transistor, and said firing transistor together form a voltage divider; and
   an edge detector provided downstream of said voltage divider.

4. The circuit configuration according to claim 3, including a bi-stable trigger circuit operatively connected to said edge detector such that said edge detector acts on said bi-stable trigger circuit.

5. The circuit configuration according to claim 1, wherein said circuit is configured such that a given course of the switching operation permits access to the test mode of said circuit.

6. The circuit configuration according to claim 2, including:
   a sense transistor connected in parallel to said firing transistor such that said fusible link, said sense transistor, and said firing transistor together form a voltage divider;
   a window comparator provided downstream of said voltage divider; and
   a time-voltage converter operatively connected to said window comparator such that said window comparator acts on said time-voltage converter.

7. The circuit configuration according to claim 6, including a bi-stable trigger circuit provided downstream of said time-voltage converter.

8. The circuit configuration according to claim 1, including a time counter operatively connected to said switching element such that the switching operation starts said time counter, and said time counter blocks access to the test mode of said circuit after a given time.

9. The circuit configuration according to claim 7, wherein:
   said bi-stable trigger circuit has an input; and
   a time counter acts on said input of said bi-stable trigger circuit such that the switching operation starts said time counter, and said time counter blocks access to the test mode of said circuit after a given time.

10. The circuit configuration according to claim 1, including further switching elements, said switching element and said further switching elements being configured to be individually actuated one after another.

11. The circuit configuration according to claim 10, including a control unit operatively connected to said switching elements, said control unit being configured such that a number of actuated ones of said switching elements can be read out.

12. The circuit configuration according to claim 11, wherein said control unit is a counter.

13. A circuit configuration in combination with a chip card, comprising:
   A circuit having a switching element configured to be switched only once; and
   said circuit having a test mode, said switching element, when being actuated, causing a switching operation permitting access to the test mode of said circuit in combination with the chip card.

14. A circuit configuration in combination with a security chip, comprising:
   A circuit having a switching element configured to be switched only once; and
   said circuit having a test mode, said switching element, when being actuated, causing a switching operation permitting access to the test mode of said circuit in combination with the security chip.

* * * * *